United States Patent
LaCroix et al.

(10) Patent No.: US 9,390,895 B2
(45) Date of Patent: Jul. 12, 2016

(54) GAS INJECTOR PARTICLE REMOVAL PROCESS AND APPARATUS

(71) Applicant: Lam Research Corporation, Fremont, CA (US)

(72) Inventors: Cliff LaCroix, Fremont, CA (US); Armen Avoyan, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 588 days.

(21) Appl. No.: 13/929,890

(22) Filed: Jun. 28, 2013

(65) Prior Publication Data

US 2015/0000712 A1    Jan. 1, 2015

(51) Int. Cl.
| | |
|---|---|
| *B08B 11/00* | (2006.01) |
| *H01J 37/32* | (2006.01) |
| *B08B 3/10* | (2006.01) |
| *B08B 3/12* | (2006.01) |
| *C11D 11/00* | (2006.01) |

(52) U.S. Cl.
CPC ............. *H01J 37/32862* (2013.01); *B08B 3/10* (2013.01); *B08B 3/12* (2013.01); *C11D 11/007* (2013.01); *C11D 11/0041* (2013.01)

(58) Field of Classification Search
CPC .................................................. H01J 37/32862
See application file for complete search history.

(56) References Cited

U.S. PATENT DOCUMENTS 7,767,028 B2 * 8/2010 Augustino .......... C23C 16/4405
                                                        134/137

FOREIGN PATENT DOCUMENTS

| CN | 1228197 | 9/1999 |
|---|---|---|
| CN | 1779920 | 5/2006 |
| CN | 101276742 | 10/2008 |
| CN | 102007579 | 4/2011 |
| EP | DE10036809 | 2/2002 |
| JP | 09-000806 A | 1/1997 |

* cited by examiner

Primary Examiner — Michael Barr
Assistant Examiner — Jason Riggleman
(74) Attorney, Agent, or Firm — Beyer Law Group LLP

(57) ABSTRACT

A sonic cleaning tool having a component retaining fixture, a sonic bath, and a cleaning fluid circulating system. The sonic bath has a sound field transducer and is structurally configured to place the component retaining fixture in sonic communication with the sound field transducer within the sonic bath. The component retaining fixture comprises a first end plate, a second end plate, a first component securing member, a second component securing member, and a plurality of compression studs. The first component securing member projects from the first end plate and is structurally configured for repeatable transition between a retracted position and an extended position. The second component securing member projects from the second end plate. The compression studs of the component retaining fixture span from the first end plate to the second end plate and are spaced to form a plurality of sonic transmission windows between the compression studs. The sonic transmission windows collectively place a majority of a component disposed in the component retaining fixture in substantially unobstructed sonic communication with the sound field transducer of the sonic bath. The cleaning fluid circulating system has a cleaning fluid, a cleaning fluid supply reservoir, a deionized water supply, and a compressed dry air supply, which are fluidly connected to the component retaining fixture.

19 Claims, 3 Drawing Sheets

GAS INJECTOR PARTICLE REMOVAL PROCESS AND APPARATUS

BACKGROUND

The present disclosure relates to an apparatus and related process of removing particles from an interior surface.

Processing of substrates, such as semiconductor wafers, may include a variety of operations. One such operation is etching the substrate for example. Processing of semiconductor wafers and other substrates requires an environment clean from foreign debris and contaminants. The presence of contaminants would potentially yield unacceptable work product. Conventionally, injectors used in plasma processing operation are cleaned by manually scrubbing the interior surfaces to the extent accessible. Such a procedure is believed to not render the injector free of particulate contaminants such as ceramic and yttria particles. The present inventors have recognized a need for more effective alternative for removing particles, such as ceramic and Yttria particles, from the confined surfaces of an injector.

BRIEF SUMMARY

According to the subject matter of the present disclosure, a sonic cleaning tool is provided to remove particles from a surface. The sonic cleaning tool is intended to remove particles, for example alumina and yttria particles, from the interior surface of injectors used in plasma processing operation. The sonic cleaning tool comprises a sonic bath for submerging the component to be cleaned and facilitating exposure to acoustic energy.

In accordance with one embodiment of the present disclosure, a sonic cleaning tool comprises a component retaining fixture, a sonic bath, and a cleaning fluid circulating system. The sonic bath includes a sound field transducer and is structurally configured to place the component retaining fixture in sonic communication with the sound field transducer. The component retaining fixture comprises a first end plate, a second end plate, a first component securing member, a second component securing member, and a plurality of compression studs. The first component securing member of the component retaining fixture projects from the first end plate and includes an advancing shaft, a component engaging saddle and a cleaning fluid delivery channel. The cleaning fluid delivery channel extends through the advancing shaft and the component engaging saddle. The advancing shaft of the first component securing member is structurally configured for repeatable transition between a retracted position and an extended position. The second component securing member of the component retaining fixture projects from the second end plate and has a cleaning fluid outlet channel. The compression studs of the component retaining fixture span from the first end plate of the component retaining fixture to the second end plate of the component retaining fixture and are spaced to form a plurality of sonic transmission windows between the compression studs. The sonic transmission windows collectively place a majority of a component disposed in the component retaining fixture in substantially unobstructed sonic communication with the sound field transducer of the sonic bath. The cleaning fluid circulating system comprises a cleaning fluid, a cleaning fluid supply reservoir, a deionized water supply, and a compressed dry air supply, which are each fluidly connected to the cleaning fluid delivery channel.

In accordance with another embodiment of the present disclosure, a component retaining fixture comprises a first end plate, a second end plate, a first component securing member, a second component securing member, and a plurality of compression studs. The first component securing member of the component retaining fixture projects from the first end plate and includes an advancing shaft, a component engaging saddle and a cleaning fluid delivery channel extending through the advancing shaft and the component engaging saddle. The advancing shaft is structurally configured for repeatable transition between a retracted position and an extended position and is further structurally configured to be threadably advanced from the retracted position to the extended position. The second component securing member projects from the second end plate and comprises a cleaning fluid outlet channel. The compression studs of the component retaining fixture span from the first end plate of the component retaining fixture to the second end plate of the component retaining fixture and pass through apertures disposed in the first end plate and the second end plate. The compression studs also have a tightening knob on a second end. The compression studs are spaced to form a plurality of sonic transmission windows between the compression studs which collectively place a majority of a component disposed in the component retaining fixture in substantially unobstructed sonic communication with a sound field transducer.

In accordance with another embodiment of the present disclosure, an ultrasonic cleaning tool comprises a component retaining fixture, a sonic bath, and a cleaning fluid circulating system. The sonic bath includes a sound field transducer and is structurally configured to place the component retaining fixture in sonic communication with the sound field transducer within the sonic bath. The component retaining fixture has a first end plate, a second end plate, a first component securing member, a second component securing member, and a plurality of compression studs. The first component securing member of the component retaining fixture projects from the first end plate and comprises an advancing shaft, a component engaging saddle and a cleaning fluid delivery channel extending through the advancing shaft and the component engaging saddle. The second component securing member of the component retaining fixture projects from the second end plate and includes a cleaning fluid outlet channel. The compression studs span from the first end plate of the component retaining fixture to the second end plate of the component retaining fixture and are spaced to form a plurality of sonic transmission windows between the compression studs. The cleaning fluid circulating system has a cleaning fluid supply reservoir, a deionized water supply, and a compressed dry air supply, which are fluidly connected to the cleaning fluid delivery channel. Further, the cleaning fluid outlet channel is fluidly connected to the cleaning fluid supply reservoir.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
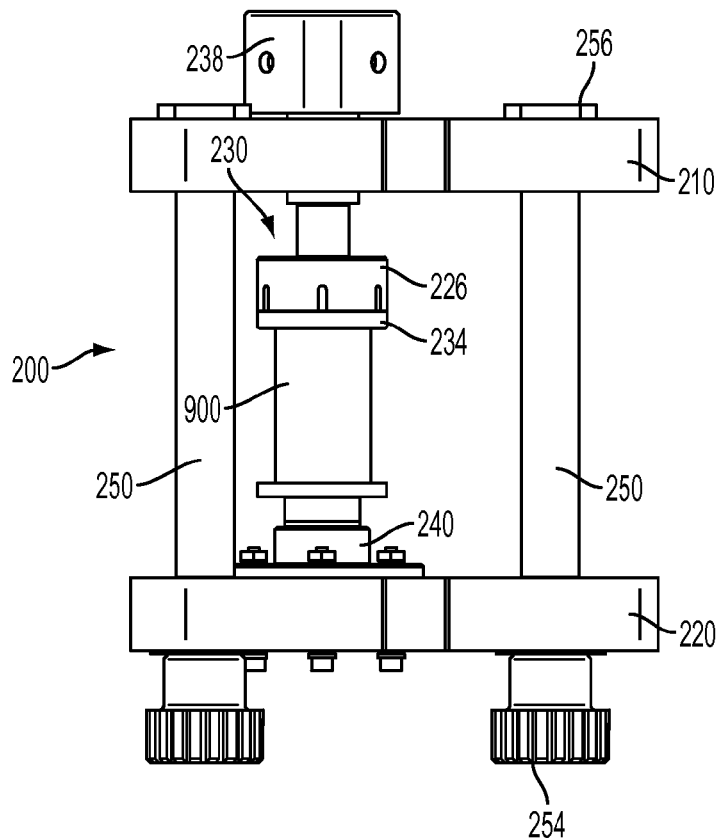
FIG. 1 is a side profile view of a component retaining fixture according to one embodiment of the present disclosure.
Figure 2:
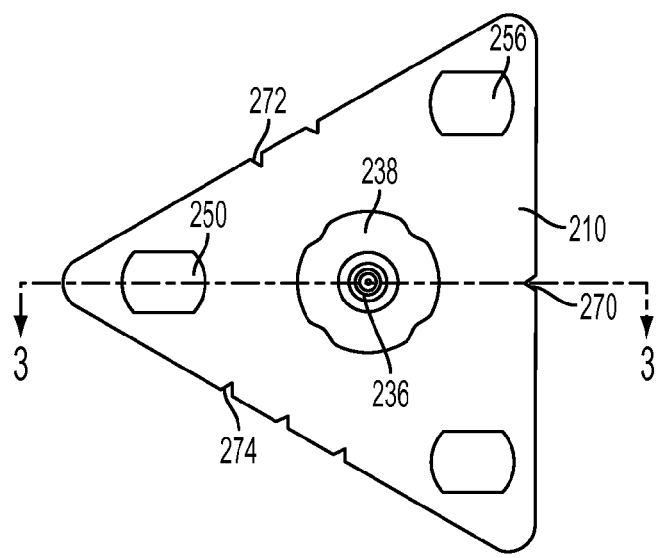
FIG. 2 is a top profile view of a component retaining fixture according to one embodiment of the present disclosure.
Figure 3:
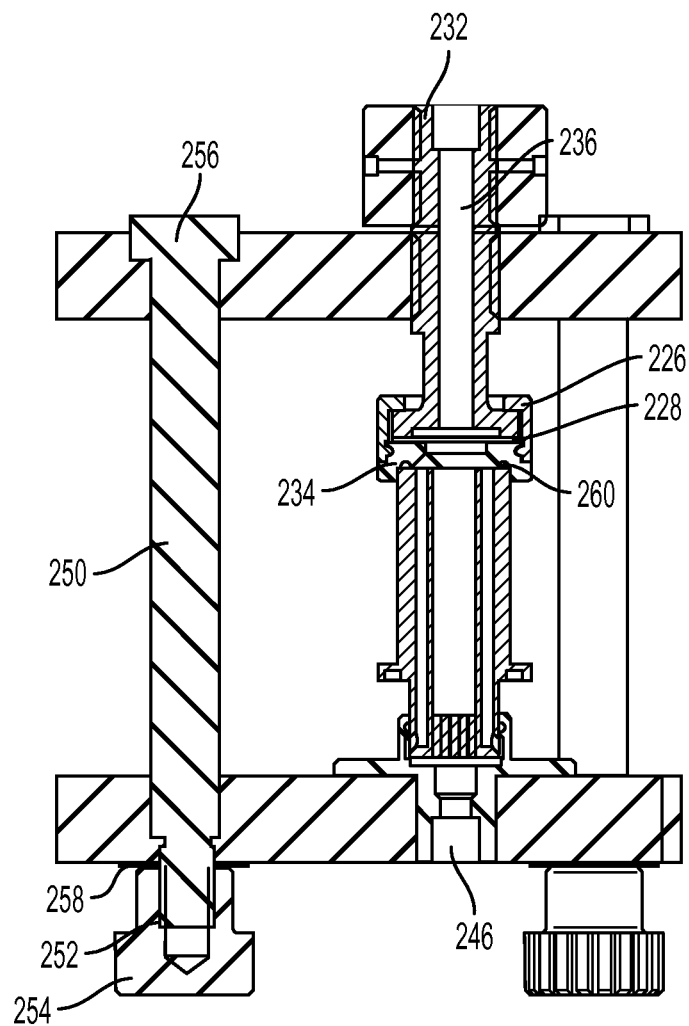
FIG. 3 is a cut side profile view of a component retaining fixture according to one embodiment of the present disclosure.
Figure 4:
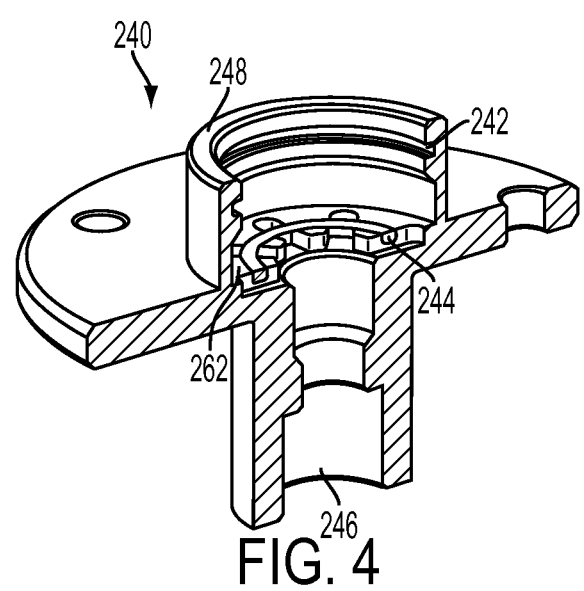
FIG. 4 is a cut isometric view of a second component securing member according to one embodiment of the present disclosure.
Figure 5:
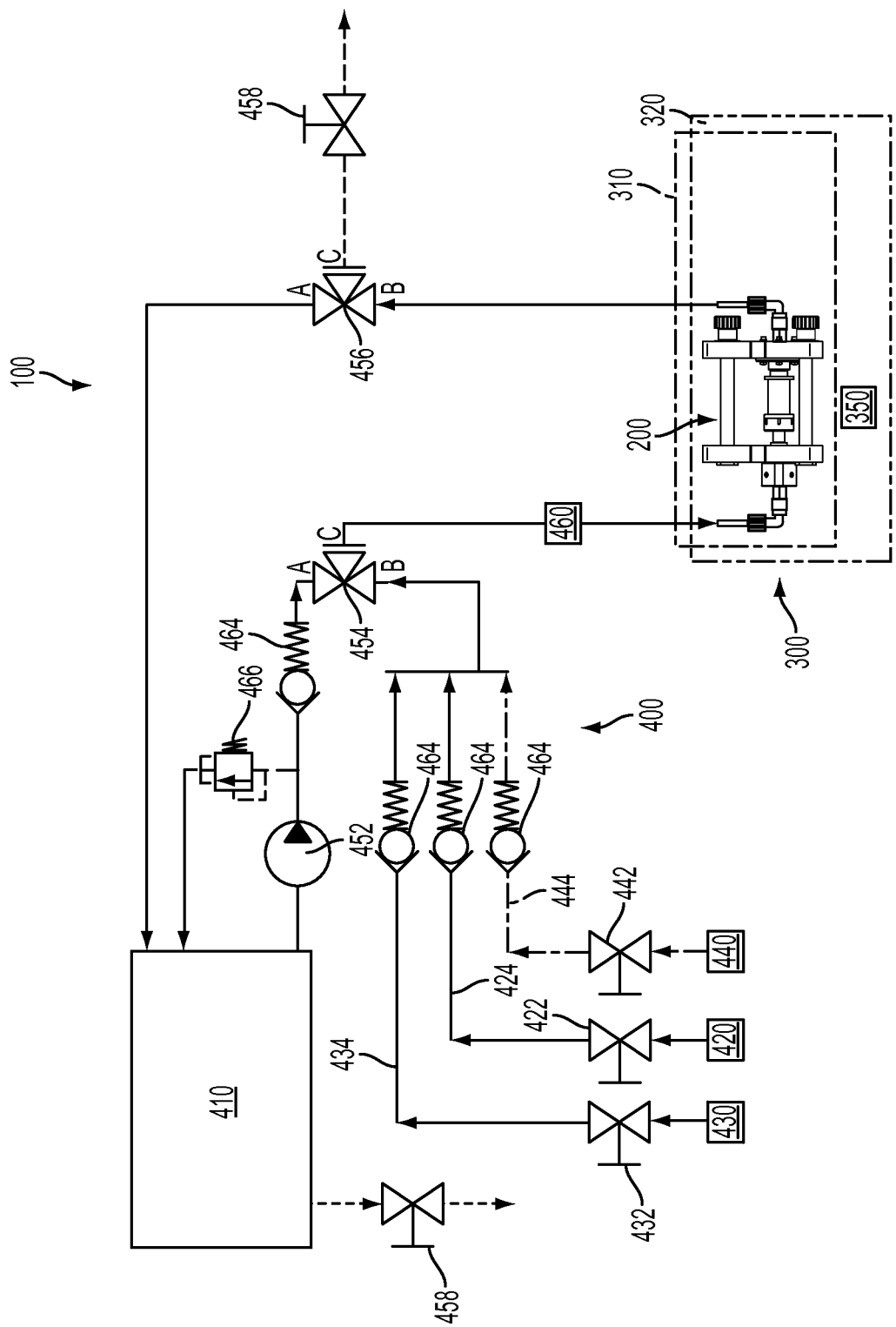
FIG. 5 is a schematic of a sonic cleaning tool according to one embodiment of the present disclosure.

Referring to the drawings in general and to FIGS. 1 and 5 in particular, it will be understood that the illustrations are for the purpose of describing a particular embodiment of the present disclosure and are not intended to limit the scope of the appended claims. A sonic cleaning tool 100 comprises a component retaining fixture 200, a sonic bath 300, and a cleaning fluid circulating system 400. The sonic bath 300 comprises a sound field transducer 350 and is structurally configured to place the component retaining fixture 200 in sonic communication with the sound field transducer 350 within the sonic bath 300. The component retaining fixture 200 comprises a first end plate 210, a second end plate 220, a first component securing member 230, a second component securing member 240, and a plurality of compression studs 250. The cleaning fluid circulating system 400 comprises a cleaning fluid supply reservoir 410, a deionized water supply 420, and a compressed dry air supply 440.

The sonic cleaning tool 100 provides sonic cleaning to a component 900 disposed in the component retaining fixture 200. Cleaning fluid is introduced into the component 900 through the first component securing member 230. The cleaning fluid passes through the component 900 and exits through the second component securing member 240. While passing through the component 900, the cleaning fluid dislodges and sweeps foreign particles from the component. Additionally, sonic waves, for example in the ultrasonic or megasonic range, are produced by the sound field transducer 350. The acoustic energy in conjunction with the cleaning fluid provides a cleaning action on the interior surfaces of the component 900. The flow of the cleaning fluid out through the second component securing member 240 carries removed particles or contaminants away from the component 900. The cleaning of the component 900 is achieved with the acoustic energy; the flow of cleaning fluid is to flush removed particles away.

In an embodiment, the component 900 is a ceramic gas injector used in semiconductor processing and production.

In an embodiment, the component retaining fixture 200 comprises a first end plate 210, a second end plate 220, a first component securing member 230, a second component securing member 240, and a plurality of compression studs 250. The first component securing member 230 of the component retaining fixture 200 projects from the first end plate 210 and comprises an advancing shaft 232, a component engaging saddle 234 and a cleaning fluid delivery channel 236 extending through the advancing shaft and component engaging saddle. The cleaning fluid delivery channel 236 forms a pathway between a fitting (not shown) to interface with the cleaning fluid circulating system 400 and the component 900. The advancing shaft 232 of the first component securing member 230 is structurally configured for repeatable transition between a retracted position and an extended position.

In an embodiment, the second component securing member 240 of the component retaining fixture 200 projects from the second end plate 220 and comprises a cleaning fluid outlet channel 246. The cleaning fluid outlet channel 246 forms a pathway between the component 900 and a fitting (not shown) to interface with the cleaning fluid circulating system 400. The fittings are envisioned as any standard fitting known to one in the art for connecting fluid lines together. Non-limiting examples include a threaded interface, a quick-connect style coupling with a sliding collet, and/or a camlock coupling.

In an embodiment, the fittings fluidly connecting the cleaning fluid delivery channel 236 and the cleaning fluid outlet channel 246 to the cleaning fluid circulating system 400 comprise a flexible cable. The flexible cables facilitate at least repositioning and rotation of the component retaining fixture 200 in the sonic bath 300.

In an embodiment, the advancing shaft 232 of the first component securing member 230 is structurally configured for repeatable transition between a retracted position and an extended position. When the advancing shaft 232 is in the retracted position, the gap between the first component securing member 230 and the second component securing member 240, more specifically the gap between the component engaging saddle 234 and the second component securing member, is sufficient to freely insert a component 900. Upon movement of the advancing shaft 232 to the extended position, the gap between the component engaging saddle 234 and the second component securing member 240 is reduced and the component 900 is locked into place.

In an embodiment, the advancing shaft 232 is substantially configured to be threadably advanced from the retracted position to the extended position. Rotation of the advancing shaft 232 causes the advancing shaft and the affixed component engaging saddle 234 to move longitudinally. External threads on the advancing shaft 232 engage with coordinating internal threads on the first end plate 210. In an embodiment, an advancing shaft handle 238 is affixed to the advancing shaft 232. The advancing shaft handle 238 assists in manipulating and rotating the advancing shaft from the retracted position to the extended position and from the extended position to the retracted position.

In an embodiment, the component engaging saddle 234 is free to rotate in relation to the advancing shaft 232. When the advancing shaft 232 is rotated to engage or disengage the component 900, the component engaging saddle 234 is stationary against the component. In an embodiment, to reduce friction between the component engaging saddle 234 and the advancing shaft 232, a securing member washer 228 is disposed between the component engaging saddle and the advancing shaft. In an embodiment, the securing member washer 228 is comprised of polytetrafluoroethylene (PTFE).

In an embodiment, the component engaging saddle 234 comprises a saddle sealing member channel and a saddle sealing member 260 disposed therein. The saddle sealing member 260 forms a fluid tight seal between the component engaging saddle 234 and the component 900 to prevent and/or reduce egress of the cleaning fluid during operation. In an embodiment, the saddle sealing member 260 is an o-ring.

In an embodiment, the component engaging saddle 234 and the advancing shaft 232 are secured together with an engaging saddle clip 226. The engaging saddle clip 226 comprises a plurality of finger elements which latch over a complementary receiving groove on the component engaging saddle 234.

The component 900 is secured to the second end plate 220 with the second component securing member 240. The second component securing member 240 comprises a collar 248 to accept an end of the component 900. The collar 248 surrounds the end of the component 900. Additionally, the second component securing member 240 comprises an exit seat 262 surrounding the cleaning fluid outlet channel 246. In an embodiment, a collar sealing member 242 is disposed around an interior wall of the collar 248. The collar sealing member 242 forms a seal between the collar 248 and the component 900 to prevent expulsion of cleaning fluid through the interface. The collar sealing member 242 ensures cleaning fluid passing through the component 900 and component retaining fixture 200 exits via the cleaning fluid outlet channel 246.

In an embodiment, an exit seat sealing member 244 is disposed in the exit seat 262 of the second component securing member 240 surrounding the cleaning fluid outlet channel 246. The exit seat sealing member 244 is compressible and allows slight travel of the component 900 as the cleaning fluid flow rate changes. The saddle sealing member 260 and the exit seat sealing member 244 allow the component 900 to float between the first component securing member 230 and the second component securing member 240. The saddle sealing member 260 and the exit seat sealing member 244 have compressibility sufficient to yield under cleaning fluid surges attributable to initiation and termination of cleaning fluid flow through the component retaining fixture 200 and component 900. Additionally, the saddle sealing member 260 and the exit seat sealing member 244 have resiliency sufficient to prevent abutment of the component 900 and the exit seat 262 and/or component engaging saddle 234.

The floating arrangement of the component 900 in the component retaining fixture 200 allows for improved shock absorption when the pressure or flow rate of cleaning fluid through the component retaining fixture and component changes. While an O-ring type seal is shown for the exit seat sealing member 244 and saddle sealing member 260, alternate embodiments include other types and styles of seals known in the art.

In an embodiment, the compression studs 250 of the component retaining fixture 200 span from the first end plate 210 of the component retaining fixture to the second end plate 220 of the component retaining fixture. The compression studs 250 hold the first end plate 210 and the second end plate 220 apart at a predefined distance to allow engagement of a component 900 when the advancing shaft 232 is transitioned from the retracted position to the extended position. Replacement of compression studs 250 with compression studs of a different length allows the component retaining fixture 200 to accommodate components 900 of differing lengths.

The compression studs 250 of the component retaining fixture 200 are spaced to form a plurality of sonic transmission windows between the compression studs. The sonic transmission windows collectively place a majority of a component 900 disposed in the component retaining fixture 200 in substantially unobstructed sonic communication with the sound field transducer 350 of the sonic bath 300.

In an embodiment, the compression studs 250 of the component retaining fixture 200 each comprise a threaded portion 252 and a tightening knob 254 disposed on at least one end of the compression studs. The compression studs 250 pass through apertures disposed in the first end plate 210 and the second end plate 220.

In an embodiment, the compression studs 250 comprise a flange 256 on a first end of the compression studs and a threaded portion 252 and a tightening knob 254 on a second end of the compression studs. The compression studs 250 pass through apertures disposed in the first end plate 210 and the second end plate 220. At least one of the first end plate 210 and the second end plate 220 comprise recessed portions substantially matching the geometry of the flange 256 and in alignment with the apertures. The flange 256 engages with the recessed portion in the first end plate 210 and/or the second end plate 220. In an embodiment the flange 256 and corresponding recessed portion are non-circular. The non-circular geometry prevents relative rotation between the compression studs 250 and the first end plate 210 and/or second end plate 220. The engagement to prevent rotation between the flange 256 and corresponding recessed portion allows the tightening knob 254 to be affixed to the compression stud 250 and secured without the need for any tools.

In an embodiment, a compression stud washer 258 is disposed between the second end plate 220 and the tightening knob 254 of each compression stud 250. The compression stud washers 258, positioned surrounding the threaded portion 252 of each compression stud 250, provide a reduced friction bearing surface between the second end plate 220 and the tightening knob 254 of each compression stud. In an embodiment, the compression stud washers 258 are comprised of polytetrafluoroethylene (PTFE).

In an embodiment, the first end plate 210 and the second end plate 220 each comprise a substantially triangular geometry. Accordingly, the component retaining fixture 200 comprises three compression studs 250 arranged at respective apexes of an equilateral triangle. When the component retaining fixture 200 is placed in the sonic bath 300, the triangular geometry provides three sides or faces which the component retaining fixture may be rested on. Rotation of the component retaining fixture 200 between each of the three faces helps ensure all surfaces of the component 900 are exposed to acoustic energy from the sound field transducer 350. With an equilateral triangle geometry, the entire component retaining fixture 200 may be rotated in 120 degree increments.

In an embodiment, each face of at least the first end plate 210 or the second end plate 220 comprise comprises a different marking to differentiate each face. For example, in an embodiment wherein the first end plate 210 and the second end plate 220 each comprise three sides, the first end plate and/or the second end plate may comprise a single notch 270 on a first side, a double notch 272 on a second side, and a triple notch 274 on a third side.

In an embodiment, the sonic bath 300 comprises an inner liner tank 310 disposed within an outer sonic tank 320. The dual-tank arrangement assists in the maintenance of a clean environment in the inner liner tank 310. For example, clean deionized water is flowed into the inner liner tank 310 and allowed to spill over into the outer sonic tank 320. Any contaminants or particles removed from the exterior surfaces of the component 900 or the component retaining fixture 200 is swept away by the flowing clean deionized water. The outer sonic tank 320 and the fluid disposed therein is not in direct contact with the component 900 or the component retaining fixture 200 and thus concerns about cross contamination are eliminated.

The sound field transducer 350 generates acoustic waves. The acoustic waves generated by the sound field transducer 350 create cavitation pockets in the cleaning fluid passing through the component 900 disposed in the component retaining fixture 200. Ultrasonic cleaning and megasonic cleaning uses cavitation bubbles induced by high frequency pressure waves induced by the sound waves to agitate a liquid. In a cleaning operation, cavitation is the process in which a bubble in a fluid is forced to oscillate in size or shape due to the energy input from the sound field transducer 350. The cavitation bubbles produce high forces on contaminants or particles adhering to the walls of the component 900 for example. The cleaning action also penetrates blind holes, cracks, and recesses.

In an embodiment, the inner liner tank 310 is sized to fully submerge a component 900 disposed in the component retaining fixture 200 when the component retaining fixture is placed in the inner liner tank. Submersion of the component retaining fixture 200 and component 900 allows the acoustic waves from the sound field transducer 350 to reach all surfaces.

In an embodiment, the component 900 preferably receives approximately 5 to approximately 25 W/in$^2$ of acoustic energy and more preferably receives approximately 10 to approximately 20 W/in$^2$ of acoustic energy.

The frequency of the acoustic waves generated by the sound field transducer 350 affects the characteristics of the particles optimized for removal. The frequency has an effect on particle removal of particles of varying sizes. As a general rule lower frequencies tend to remove larger particles and higher frequencies tend to be the optimum frequency for smaller particles. The sonic cleaning tool 100 may be fitted with a sound field transducer 350 which generates any specific desired frequency allowing for the particle removal tool to be adapted for various different particles with differing optimum removal frequencies. In an embodiment the sound field transducer 350 comprises an ultrasonic transducer and generates acoustic waves with a frequency between approximately 20 kHz and approximately 50 kHz. Non-limiting examples of acoustic wave frequencies are a frequency of approximately 20 kHz, approximately 30 kHz, or approximately 40 kHz. In another embodiment the sound field transducer 350 comprises a megasonic transducer and generates acoustic waves with a frequency between approximately 0.8 MHz and approximately 1.2 MHz. A non-limiting example of an acoustic wave frequency generated by the sound field transducer 350 is a frequency of approximately 1 MHz. In an embodiment, the sound field transducer 350 is capable of generating swept frequencies such that the sound field transducer outputs varying acoustic wave frequencies. Additionally, a sound field transducer 350 which generates at least two distinct frequencies is envisioned.

In an embodiment, the sound field transducer 350 is removable and capable of being replaced with at least a second sound field transducer. The ability to swap a sound field transducer 350 for a second sound field transducer allows for different acoustic wave frequencies to be generated from a single sonic cleaning tool 100. For example, an initial cleaning operation can be undertaken using a sound field transducer 350 generating acoustic waves at approximately 40 kHz and then the sound field transducer is exchanged and a second cleaning operation is undertaken with acoustic waves at approximately 1 MHz. A single sonic cleaning tool 100 is capable of removing a variety of particles in coordination with sound field transducers 350 of differing frequency set points. Additionally, a replaceable sound field transducer 350 reduces maintenance costs by allowing for replacement of only the sound field transducer in the event of a failure, opposed to the entire sonic bath 300 and sound field transducer combination.

Referring to FIG. 5, in an embodiment, the sonic cleaning tool 100 comprises a cleaning fluid circulating system 400 containing a cleaning fluid. The cleaning fluid circulating system 400 provides a cleaning fluid from the cleaning fluid supply reservoir 410 to the component retaining fixture 200. In an embodiment, the cleaning fluid comprises deionized water. The deionized water is sourced from a deionized water supply 420. In an embodiment, the deionized water supply 420 is a tank or similar reservoir. In a further embodiment, the deionized water supply 420 is a continuous source capable of delivering a stream of undefined volume. A non-limiting example of a continuous source is on-demand deionized water generation.

In an embodiment, the cleaning fluid comprises a chemical solution. The chemical solution, in an embodiment, comprises a surfactant, an acid, and an oxidizing agent. In another embodiment the chemical solution comprises a surfactant, a base, and an oxidizing agent. The chemical solution is sourced from a chemical supply 430. In an embodiment, the chemical supply 430 is a tank or similar reservoir. In a further embodiment, the chemical supply 430 is a continuous source capable of delivering a stream of undefined volume. A non-limiting example of a continuous source is batch chemical solution generation to replace depletion from a demand buffering vessel.

In an embodiment the chemical solution in the chemical supply 430 is SC1. SC1, Standard Clean 1, is an industry accepted standard alkaline cleaning solution. The classic formulation is $NH_4OH$ (Ammonium Hydroxide), $H_2O_2$ (Hydrogen Peroxide, and deionized water at a ratio of 1:1:5. In an embodiment the SC1 is utilized at the standard formulation. In another embodiment the SC1 is utilized in a dilute formulation with the ratio of deionized water higher.

In an embodiment the chemical solution in the chemical supply 430 is SC2. SC2, Standard Clean 2, is an industry accepted standard etching and cleaning solution. The classic formulation is HCl (Hydrochloric Acid), $H_2O_2$ (Hydrogen Peroxide, and deionized water at a ratio of 1:1:5. In an embodiment the SC2 is utilized at the standard formulation. In another embodiment the SC2 is utilized in a dilute formulation with the ratio of deionized water higher.

In an embodiment surfactants are included in the chemical solution. Non-limiting examples of acceptable surfactants include alkyl phenoxy polyethylene oxide alcohol, for example NCW 601A (Wako Chemicals) and Triton X-100 (Union Carbide); alkyl phenoxy polyglycidols, for example Olin Hunt Surfactants (OHSR); fluorinated alkyl sulfonates, for example Fluorad FC-93 (3M); acetylenic alcohols, for example Surfynol (APCI); and betaines, for example cocamidopropyl betaine.

In an embodiment, the cleaning fluid circulating system 400 includes at least one cleaning fluid delivery pump 452. The cleaning fluid delivery pump 452 provides the motive force to transport the cleaning fluid from the cleaning fluid supply reservoir 410 to the component retaining fixture 200. Non-limiting examples of cleaning fluid delivery pumps 452 include centrifugal pumps and peristaltic pumps. It is understood and envisioned that any method of imparting a motive force to a fluid in a pipe known to one skilled in the art may be used.

Referring to FIG. 5, in an embodiment of the sonic cleaning tool 100, a deionized water feed stream 424 from the deionized water supply 420 and a chemical solution feed stream 434 from the chemical supply 430 are combined in the cleaning fluid supply reservoir 410 prior to reaching the cleaning fluid delivery pump 452. The respective flow rates of deionized water from the deionized water supply 420 and chemical solution from the chemical supply 430 can be controlled by adjusting the deionized water supply flow valve 422 and/or the chemical supply flow valve 432. The differing flow rates of deionized water from the deionized water supply 420 and chemical solution from the chemical supply 430 allows for varying the potency of the final cleaning fluid by adjusting the chemical solution and deionized water ratio.

In an embodiment, the deionized water supply 420 and the chemical supply 430 are both in fluid communication with the cleaning fluid supply reservoir 410. The mixed streams from the deionized water supply 420 and the chemical supply 430 are introduced into the cleaning fluid supply reservoir 410 for storage and further blending.

In an embodiment the cleaning fluid supply reservoir 410 is filled without passage of the individual constituents of the cleaning fluid through the component retaining fixture 200. In an embodiment the cleaning fluid supply reservoir 410 is filled with premixed cleaning solution from an alternate reservoir. In another embodiment the cleaning fluid supply reservoir 410 is filled with the deionized water feed stream 424 and the chemical solution feed stream 434 via valves (not shown) which feed into the cleaning fluid supply reservoir 410 placed between the cleaning fluid selector valve 454 and each of the deionized water supply 420 and the chemical supply 430.

The independently controlled flow characteristics of the deionized water feed stream 424 and the chemical solution feed stream 434 allows for the ratio of deionized water and chemical solution in the cleaning fluid to be adjusted. In an embodiment the cleaning fluid is preferably provided at the cleaning fluid delivery channel 236 of the component retaining fixture 200 at a pH between approximately 2 and approximately 12. The cleaning fluid is more preferably provided at the component retaining fixture 200 at a pH between approximately 3 and approximately 4 for acidic applications and at a pH between approximately 10 and approximately 11 for basic water feed stream 424, the chemical solution feed stream 434, and the compressed air feed stream 444). In an embodiment, the cleaning fluid circulating system 400 comprises a recirculation selector valve 456. The recirculation selector valve 456 adjusts the flow of the stream exiting the component retaining fixture 200 from a drain line to a recirculation line back into the cleaning fluid supply reservoir 410. In an embodiment, the cleaning fluid circulating system 400 comprises drain valves 458. The drain valves 458 allow the cleaning fluid, compressed dry air, deionized water, and/or chemical solution to be removed from the cleaning fluid circulating system 400. In an embodiment, a drain valve 458 is disposed subsequent to the component retaining fixture 200 to drain away cleaning fluid after passage through the component retaining fixture and another drain valve is disposed in connection with the cleaning fluid supply reservoir 410 to drain any unwanted cleaning fluid after processing and cleaning of components 900.

In accordance with the above described valves, numerous combinations of fluid flow may be achieved.

| | Cleaning Fluid Selector Valve 454 | Recirculation Selector Valve 456 | Deionized Water Supply Flow Valve 422 | Chemical Supply Flow Valve 432 | Compressed Dry Air Supply Flow Valve 442 |
|---|---|---|---|---|---|
| Cleaning Fluid | Open (A-C) | Open (A-B) | Closed | Closed | Closed |
| Deionized Water | Open (B-C) | Open (B-C) | Open | Closed | Closed |
| Compressed Dry Air | Open (B-C) | Open (B-C) | Closed | Closed | Open |
| Deionized Water and Compressed Dry Air | Open (B-C) | Open (B-C) | Open | Closed | Open |
| Cleaning Fluid Preparation | Open (B-C) | Open (A-B) | Open | Open | Closed | applications. The increased cleaning fluid pH lowers the attractive force between particles and the interior surfaces of the component 900.

In an embodiment, the cleaning fluid circulating system 400 includes a compressed dry air supply 440. The compressed air feed stream 444, in combination with the deionized water feed stream 424 and/or the chemical solution feed stream 434, may be used to dislodge and clean particles from the interior surfaces of the component 900. The compressed air may be used in combination with or independent of the acoustic energy generated by the sound field transducer 350.

In an embodiment, the cleaning fluid circulating system 400 comprises a combination of control valves. The control valves adjust the flow path of the cleaning fluid and/or the cleaning fluid constituents. The flow rates of the deionized water feed stream 424, the chemical solution feed stream 434, and the compressed air feed stream 444 can be controlled using the deionized water supply flow valve 422, the chemical supply flow valve 432, and the compressed dry air supply flow valve 442 respectively. Additionally, in an embodiment, check valves 464 are disposed in the deionized water feed stream 424, the chemical solution feed stream 434, and the compressed air feed stream 444 to prevent backflow when a particular stream is not used. In an embodiment, the cleaning fluid circulating system 400 comprises a cleaning fluid selector valve 454. The cleaning fluid selector valve 454 adjusts the feed stream going to the component retaining fixture 200 between the cleaning fluid from the cleaning fluid supply reservoir 410 and the constituent feed streams (the deionized Referring again to FIG. 5, in embodiments, the sonic cleaning tool 100 further comprises at least one thermal control unit 460 to adjust the temperature of the cleaning fluid. It is envisioned that the thermal control unit 460 may increase the temperature of the cleaning fluid or may decrease the temperature of the cleaning fluid. In an embodiment, a single thermal control unit 460 is utilized with the combined deionized water feed stream 424 and chemical solution feed stream 434 passing through the single thermal control unit. The temperature of the cleaning fluid is adjusted in-line as it passes through the cleaning fluid circulating system 400. In another embodiment (not shown), the thermal control unit 460 is placed within the cleaning fluid supply reservoir 410 and adjusts the temperature of the bulk reserve of cleaning fluid. Utilization of a single thermal control unit 460 allows all the constituent components of the cleaning fluid to be heated or cooled in bulk. Since all the components are heated or cooled in the same thermal control unit 460, varying the relative flow rates of the deionized water feed stream 424 and the chemical solution feed stream 434 has no or minimal effect on the temperature of the resulting mixed cleaning fluid.

In another embodiment (not shown), at least one thermal control unit 460 is disposed in each of the deionized water feed stream 424 and the chemical solution feed stream 434. Independent thermal control units 460 for each of the deionized water feed stream 424 and the chemical solution feed stream 434 provides control of the temperature of the deionized water feed stream and the chemical solution feed stream individually. If the flow rate of the deionized water feed stream 424 or the chemical solution feed stream 434 is increased or decreased, the heat exchange rate of the respective thermal control unit 460 can be adjusted to compensate. Additionally, the heat exchange rate of the thermal control unit 460 can be adjusted as the inlet or feed temperature of the deionized water feed stream 424 or the chemical solution feed stream 434 varies.

In an embodiment, the thermal control unit 460 is a heater. The thermal control unit 460 raises the temperature of the cleaning fluid until a desired set-point is reached. The thermal control unit 460 may raise the temperature of the cleaning fluid in a batch process before circulation through the component retaining fixture 200. The thermal control unit 460 may also, for example, raise the temperature of the cleaning fluid in-line in a continuous process as the cleaning fluid flows through the cleaning fluid circulating system 400.

The thermal control unit 460 allows adjustment of the temperature of the cleaning fluid to a desired set-point or range. In an embodiment the cleaning fluid is preferably provided at the cleaning fluid delivery channel 236 at a temperature below 100° C. Specifically, the cleaning fluid is preferably maintained below the boiling point of water at the operating pressure of the sonic cleaning tool 100. Maintenance of the temperature below the boiling point of water at the operating pressure of the sonic cleaning tool 100 is desirable to prevent formation of undesirable bubbles within the cleaning fluid which reduces the effectiveness of the ultrasonic cleaning operation. The cleaning fluid is more preferably provided at the cleaning fluid delivery channel 236 at a temperature between approximately 20° C. and approximately 95° C. The cleaning fluid is even more preferably provided at the cleaning fluid delivery channel 236 at a temperature between approximately 20° C. and approximately 30° C. specifically in unheated applications and still even more preferably between approximately 24° C. and approximately 26° C. The cleaning fluid is more preferably provided at the cleaning fluid delivery channel 236 at a temperature between approximately 75° C. and approximately 85° C. specifically in heated applications and still even more preferably between approximately 78° C. and approximately 82° C. An increased cleaning fluid temperature lowers the attractive force between a particle and the interior surface of the component 900 to ease particle removal.

In an embodiment, the cleaning fluid circulating system 400 comprises at least one pressure relief valve 466. The pressure relief valve 466 helps alleviate over pressurization of the cleaning fluid stream passing throughout the cleaning fluid circulating system 400. The pressure relief valves 466 helps prevent over pressurization when the cleaning fluid selector valve 454, recirculation selector valve 456, and drain valves 458 in conjunction with cleaning fluid delivery pump 452 are not individually adjusted for optimal flow. In an embodiment the pressure relief valve 466 is positioned subsequent to the cleaning fluid delivery pump 452 and prior to any valve or other flow obstruction. The pressure relief valve 466 may, for example, relieve over-pressurized cleaning fluid back into the cleaning fluid supply reservoir 410 or vent over-pressurized cleaning fluid outside the cleaning fluid circulating system 400.

Operation of the sonic cleaning tool 100 using cleaning fluid includes a pre-step of mixing the cleaning fluid into a homogenous solution. With the cleaning fluid supply reservoir 410 supplied with all the cleaning fluid constituents, the cleaning fluid selector valve 454 is set for flow along the B-C pathway (A-C and A-B are closed). The cleaning fluid delivery pump 452 positioned at the exit of the cleaning fluid supply reservoir 410 is switched to the on position. The positioning of the cleaning fluid selector valve 454 prevents flow and the pressure relief valve 466 is opened to allow flow of the cleaning fluid back into the cleaning fluid supply reservoir 410. The cleaning fluid delivery pump 452 is operated with the cleaning fluid selector valve 454 preventing flow for approximately 2 minutes to ensure a homogeneous cleaning fluid. The cleaning fluid selector valve 454 is adjusted for A-C flow for passage of the cleaning fluid through the component retaining fixture 200. Flow is maintained for approximately 2 minutes in combination with the application of acoustic energy from the sound field transducer 350, at which time the cleaning fluid delivery pump 452 is turned off. The component 900 is removed from the component retaining fixture 200 and inspected for cleanliness. If the cleanliness of the component 900 is poor and does not meet the desired cleanliness parameters the component is reinstalled into the component retaining fixture 200 and the cleaning procedure is repeated.

Operation of the sonic cleaning tool 100 using deionized water and/or compressed air does not require preparation of the cleaning solution into a homogonous solution. The cleaning fluid delivery pump 452 is operated with the cleaning fluid selector valve 454 immediately positioned for A-C flow. Such configuration allows passage of the compressed air and/or deionized water through the component retaining fixture 200. Flow is maintained for approximately 2 minutes in combination with the application of acoustic energy from the sound field transducer 350, at which time the cleaning fluid delivery pump 452 is turned off. The component 900 is removed from the component retaining fixture 200 and inspected for cleanliness. If the cleanliness of the component 900 is poor and does not meet the desired cleanliness parameters the component is reinstalled into the component retaining fixture 200 and the cleaning procedure is repeated.

Bevels, tapers, chamfers, fillets, rounding, and other corner treatments are shown throughout the disclosed drawings. These corner treatments may not be required and the present disclosure includes those unillustrated embodiments where the corner treatments are not present. Further, embodiments are envisioned in which corners and edges which are not shown with corner treatment are beveled, tapered, chamfered, filleted, rounded, or treated with another corner treatment.

It is also noted that recitations herein of "at least one" component, element, etc., should not be used to create an inference that the alternative use of the articles "a" or "an" should be limited to a single component, element, etc.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A sonic cleaning tool comprising a component retaining fixture, a sonic bath, and a cleaning fluid circulating system, wherein:
    the sonic bath comprises a sound field transducer and is structurally configured to place the component retaining fixture in sonic communication with the sound field transducer within the sonic bath;
    the component retaining fixture comprises a first end plate, a second end plate, a first component securing member, a second component securing member, and a plurality of compression studs;
    the first component securing member of the component retaining fixture projects from the first end plate and comprises an advancing shaft, a component engaging saddle and a cleaning fluid delivery channel extending through the advancing shaft and the component engaging saddle;
    the advancing shaft of the first component securing member is structurally configured for repeatable transition between a retracted position and an extended position;
    the second component securing member of the component retaining fixture projects from the second end plate and comprises a cleaning fluid outlet channel;
    the compression studs of the component retaining fixture span from the first end plate of the component retaining fixture to the second end plate of the component retaining fixture;
    the compression studs of the component retaining fixture are spaced to form a plurality of sonic transmission windows between the compression studs;
    the sonic transmission windows collectively place a majority of a component disposed in the component retaining fixture in substantially unobstructed sonic communication with the sound field transducer of the sonic bath;
    the cleaning fluid circulating system comprises a cleaning fluid, a cleaning fluid supply reservoir, a deionized water supply, and a compressed dry air supply; and
    the cleaning fluid supply reservoir, the deionized water supply, and the dry compressed air supply are fluidly connected to the cleaning fluid delivery channel.

2. The sonic cleaning tool of claim 1, wherein the advancing shaft is substantially configured to be threadably advanced from the retracted position to the extended position.

3. The sonic cleaning tool of claim 1, wherein the first component securing member further comprises a securing member washer disposed between the advancing shaft and the component engaging saddle.

4. The sonic cleaning tool of claim 1, wherein:
    the plurality of compression studs each comprise a threaded portion and a tightening knob disposed on at least one end of the compression studs; and
    the compression studs pass through apertures disposed in the first end plate and the second end plate.

5. The sonic cleaning tool of claim 1, wherein
    the plurality of compression studs comprise a flange on a first end of the compression studs and a threaded portion and a tightening knob on a second end of the compression studs;
    the compression studs pass through apertures disposed in the first end plate and the second end plate; and
    at least one of the first end plate and the second end plate comprise recessed portions substantially matching the geometry of the flange and in alignment with the apertures.

6. The sonic cleaning tool of claim 1, wherein:
    the first end plate and the second end plate each comprise a substantially triangular geometry having three exterior faces; and
    the component retaining fixture comprises three compression studs arranged at respective apexes of an equilateral triangle.

7. The sonic cleaning tool of claim 6, wherein each of the three faces of at least the first end plate or the second end plate comprise a different marking.

8. The sonic cleaning tool of claim 1, wherein the component is a ceramic gas injector.

9. The sonic cleaning tool of claim 1, wherein the cleaning fluid circulating system further comprises a thermal control unit to adjust the temperature of the cleaning fluid.

10. The sonic cleaning tool of claim 1, wherein the sonic bath further comprises an inner liner tank disposed within an outer sonic tank.

11. The sonic cleaning tool of claim 1, wherein the cleaning fluid is pH controlled to lower the zeta potential of particles attached to interior surfaces of the component.

12. The sonic cleaning tool of claim 1, wherein the cleaning fluid comprises at least one surfactant.

13. The sonic cleaning tool of claim 10, wherein the inner liner tank is sized to fully submerge a component disposed in the component retaining fixture when the component retaining fixture is placed in the inner liner tank.

14. The sonic cleaning tool of claim 1, wherein the sonic transmission windows transmit 5 to 25 $W/in^2$ of acoustic energy from the sound field transducer.

15. The sonic cleaning tool of claim 1, wherein a component disposed in the component retaining fixture floats against resilient sealing members between the first component securing member and the second component securing member.

16. A component retaining fixture comprising a first end plate, a second end plate, a first component securing member, a second component securing member, and a plurality of compression studs, wherein:
    the first component securing member of the component retaining fixture projects from the first end plate and comprises an advancing shaft, a component engaging saddle and a cleaning fluid delivery channel extending through the advancing shaft and the component engaging saddle;
    the advancing shaft of the first component securing member is structurally configured for repeatable transition between a retracted position and an extended position;
    the advancing shaft of the first component securing member is structurally configured to be threadably advanced from the retracted position to the extended position;
    the second component securing member of the component retaining fixture projects from the second end plate and comprises a cleaning fluid outlet channel;

the compression studs of the component retaining fixture span from the first end plate of the component retaining fixture to the second end plate of the component retaining fixture;

the compression studs of the component retaining fixture pass through apertures disposed in the first end plate and the second end plate;

the compression studs of the component retaining fixture comprise a tightening knob on a second end of the compression studs;

the compression studs of the component retaining fixture are spaced to form a plurality of sonic transmission windows between the compression studs; and the sonic transmission windows collectively place a majority of a component disposed in the component retaining fixture in substantially unobstructed sonic communication with a sound field transducer.

17. The component retaining fixture of claim 16, wherein the plurality of compression studs are configured to prevent rotation relative to at least one of the first end plate and the second end plate.

18. The component retaining fixture of claim 17, wherein the compression studs of the component retaining fixture comprise a non-circular flange on a first end of the compression studs and at least one of the first end plate and the second end plate comprise recessed portions substantially matching the geometry of the non-circular flange and in alignment with the apertures.

19. An ultrasonic cleaning tool comprising a component retaining fixture, a sonic bath, and a cleaning fluid circulating system, wherein:

the sonic bath comprises a sound field transducer and is structurally configured to place the component retaining fixture in sonic communication with the sound field transducer within the sonic bath;

the component retaining fixture comprises a first end plate, a second end plate, a first component securing member, a second component securing member, and a plurality of compression studs;

the first component securing member of the component retaining fixture projects from the first end plate and comprises an advancing shaft, a component engaging saddle and a cleaning fluid delivery channel extending through the advancing shaft and the component engaging saddle;

the second component securing member of the component retaining fixture projects from the second end plate and comprises a cleaning fluid outlet channel;

the compression studs of the component retaining fixture span from the first end plate of the component retaining fixture to the second end plate of the component retaining fixture;

the compression studs of the component retaining fixture are spaced to form a plurality of sonic transmission windows between the compression studs;

the cleaning fluid circulating system comprises a cleaning fluid supply reservoir, a deionized water supply, and a compressed dry air supply;

the cleaning fluid supply reservoir, the deionized water supply, and the dry compressed air supply are fluidly connected to the cleaning fluid delivery channel; and the cleaning fluid outlet channel is fluidly connected to the cleaning fluid supply reservoir.

\* \* \* \* \*